(12) United States Patent
Jee et al.

(10) Patent No.: US 11,532,328 B2
(45) Date of Patent: Dec. 20, 2022

(54) METHOD FOR FABRICATING SEMICONDUCTOR CHIP BY USING MULTI-CURING APPARATUS AND MULTI-CURING APPARATUS

(71) Applicant: SAMSUNG ELECTRONICS CO., LTD., Suwon-si (KR)

(72) Inventors: Won Young Jee, Seoul (KR); Sung Ki Roh, Hwaseong-si (KR); Min Uk Kim, Osan-si (KR); Sung Soo Kim, Hwaseong-si (KR); Woong Sik Nam, Seoul (KR); Sung-Gyu Park, Yongin-si (KR); Se Young Oh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 930 days.

(21) Appl. No.: 16/375,157

(22) Filed: Apr. 4, 2019

(65) Prior Publication Data

US 2019/0351449 A1 Nov. 21, 2019

(30) Foreign Application Priority Data

May 18, 2018 (KR) .................. 10-2018-0057101
Feb. 1, 2019 (KR) .................. 10-2019-0013502

(51) Int. Cl.
*B05D 3/06* (2006.01)
*G11B 7/095* (2006.01)
*F01C 1/12* (2006.01)
*H01L 21/67* (2006.01)

(52) U.S. Cl.
CPC .............. *G11B 7/0953* (2013.01); *F01C 1/12* (2013.01); *H01L 21/67098* (2013.01); *H01L 21/67115* (2013.01); *B05D 3/067* (2013.01)

(58) Field of Classification Search
CPC ..... B05D 3/067; F01C 1/12; H01L 21/67115; H01L 21/67098
See application file for complete search history.

(56) References Cited

U.S. PATENT DOCUMENTS

| 6,079,386 | A | 6/2000 | Barker et al. |
| 6,559,460 | B1 | 5/2003 | Keogh et al. |
| 8,137,465 | B1 | 3/2012 | Shrinivasan et al. |
| 8,203,126 | B2 | 6/2012 | Rocha-Alvarez et al. |

(Continued)

FOREIGN PATENT DOCUMENTS

| JP | 4678620 | 4/2011 |
| KR | 1020160087953 | 7/2016 |

*Primary Examiner* — Nathaniel Herzfeld
(74) *Attorney, Agent, or Firm* — F. Chau & Associates, LLC

(57) ABSTRACT

A multi-curing apparatus includes an actuator, a first chamber including a first energy source head, a second chamber including a second energy source head, a first driver including a first rotation transmission gear gear-engaged with the actuator, and a first driving gear gear-engaged with the first chamber. The apparatus further includes a second driver including a second rotation transmission gear gear-engaged with the actuator, and a second driving gear gear-engaged with the second chamber. The apparatus aligns a position of the first chamber with reference to a position of the second chamber while the first rotation transmission gear, the second rotation transmission gear, and the second driving gear are fixed.

20 Claims, 16 Drawing Sheets

(56) References Cited

U.S. PATENT DOCUMENTS

| | | | | |
|---|---|---|---|---|
| 8,889,233 B1* | 11/2014 | Kelman | ............ | H01L 21/68771 |
| | | | | 427/508 |
| 9,433,973 B1* | 9/2016 | Ni | ........................ | C23C 16/4409 |
| 2006/0251827 A1* | 11/2006 | Nowak | ................ | B05D 3/0209 |
| | | | | 34/275 |
| 2013/0122611 A1 | 5/2013 | Yang et al. | | |
| 2014/0003800 A1* | 1/2014 | Ramamurthy | .......... | H01L 21/02 |
| | | | | 392/416 |
| 2017/0269397 A1 | 9/2017 | Komoda | | |

* cited by examiner

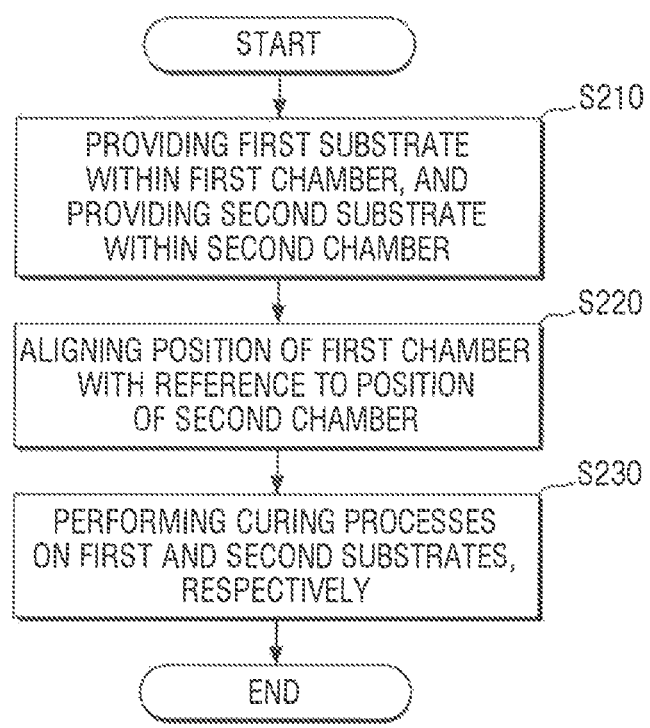

METHOD FOR FABRICATING SEMICONDUCTOR CHIP BY USING MULTI-CURING APPARATUS AND MULTI-CURING APPARATUS

CROSS-REFERENCE TO RELATED APPLICATIONS

This application claims priority under 35 U.S.C. § 119 to Korean Patent Application No. 10-2018-0057101, filed on May 18, 2018, and Korean Patent Application No. 10-2019-0013502, filed on Feb. 1, 2019, the disclosures of which are incorporated by reference herein in their entireties.

TECHNICAL FIELD

Exemplary embodiments of the present disclosure relate to a method for fabricating a semiconductor chip by using a multi-curing apparatus and a multi-curing apparatus.

DISCUSSION OF THE RELATED ART

A process of curing a material such as an adhesive or the like is commonly used during the manufacturing of semiconductor devices, displays, and various other electronic devices. A curing process that uses ultraviolet (UV) rays is widely used, and a UV curing apparatus is used to perform such a UV curing process.

In a UV curing process, a large number of UV rays is output onto a region that is to be cured. UV rays having relatively high energy per unit area are typically used for UV curing, and UV ray emitting elements such as, for example, light emitting diodes, are utilized to emit UV rays of high illuminance.

SUMMARY

Exemplary embodiments of the present disclosure provide a multi-curing apparatus for aligning positions between a plurality of chambers connected to one actuator.

Exemplary embodiments of the present disclosure further provide a method for fabricating a semiconductor chip by using a multi-curing apparatus, which aligns positions between a plurality of chambers connected with one actuator.

According to an exemplary embodiment of the present disclosure, a multi-curing apparatus includes an actuator, a first chamber including a first energy source head, a second chamber including a second energy source head, a first driver, and a second driver. The first driver includes a first rotation transmission gear gear-engaged with the actuator, and a first driving gear gear-engaged with the first chamber. The second driver includes a second rotation transmission gear gear-engaged with the actuator, and a second driving gear gear-engaged with the second chamber. The multi-curing apparatus aligns a position of the first chamber with reference to a position of the second chamber. The first rotation transmission gear, the second rotation transmission gear, and the second driving gear are fixed while the multi-curing apparatus aligns the position of the first chamber.

According to an exemplary embodiment of the present disclosure, a multi-curing apparatus includes an actuator, a first chamber including a first energy source head, a second chamber including a second energy source head, a first driver gear-engaged with the actuator and the first chamber, and a second driver gear-engaged with the actuator and the second chamber. The first driver includes a first rotation transmission gear gear-engaged with the actuator, a first driving gear disposed on the first rotation transmission gear and gear-engaged with the first chamber, a first jog gear disposed on and connected to the first driving gear, a first jog that penetrates through the first rotation transmission gear, the first driving gear, and the first jog gear, and that is connected to the first rotation transmission gear, and a first mechalock removably disposed between the first jog and the first jog gear and connecting the first jog and the first jog gear to each other. The multi-curing apparatus aligns a position of the first chamber with reference to a position of the second chamber by using (e.g., driving) the first driver. The position of the second chamber is fixed while the multi-curing apparatus aligns the position of the first chamber with reference to the position of the second chamber.

According to an exemplary embodiment of the present disclosure, a multi-curing apparatus includes an actuator, a first rotation transmission gear gear-engaged with the actuator, and a second rotation transmission gear gear-engaged with the actuator and disposed on a same plane as the first rotation transmission gear. The multi-curing apparatus further includes a first driving gear disposed on the first rotation transmission gear, a second driving gear disposed on the second rotation transmission gear, a first head gear gear-engaged with the first driving gear, a second head gear gear-engaged with the second driving gear, a first chamber disposed on the first head gear and including a first energy source head, and a second chamber disposed on the second head gear and including a second energy source head. The multi-curing apparatus aligns a position of the first chamber with reference to a position of the second chamber by driving the first driving gear. The first rotation transmission gear, the second rotation transmission gear, and the second driving gear are fixed while the multi-curing apparatus drives the first driving gear.

According to an exemplary embodiment of the present disclosure, a multi-curing apparatus includes an actuator, a first chamber including a first energy source head disposed therein, a second chamber including a second energy source head disposed therein, a first driver including a first rotation power transmitter connected with the actuator and a first driving power transmitter connected with the first chamber, and a second driver including a second rotation power transmitter connected with the actuator, and a second driving power transmitter connected with the second chamber. The multi-curing apparatus aligns a position of the first chamber with reference to a position of the second chamber with the first rotation power transmitter, the second rotation power transmitter, and the second driving power transmitter being fixed.

According to an exemplary embodiment of the present disclosure, a method for fabricating a semiconductor chip includes providing a first substrate in a first chamber gear-engaged with an actuator via a first driver, providing a second substrate in a second chamber gear-engaged with the actuator via a second driver, aligning a position of the first chamber with reference to a position of the second chamber by driving the first driver with the second driver being fixed, and curing the first substrate and the second substrate respectively. The first driver includes a first rotation transmission gear gear-engaged with the actuator and a first driving gear gear-engaged with the first chamber, and the second driver includes a second rotation transmission gear gear-engaged with the actuator and a second driving gear gear-engaged with the second chamber.

BRIEF DESCRIPTION OF THE DRAWINGS

The above and other features of the present disclosure will become more apparent by describing in detail exemplary embodiments thereof with reference to the accompanying drawings, in which:

FIG. 16 is a flowchart illustrating a method for fabricating a semiconductor chip by using a multi-curing apparatus according to exemplary embodiments of the present disclosure.

DETAILED DESCRIPTION

Figure 1:
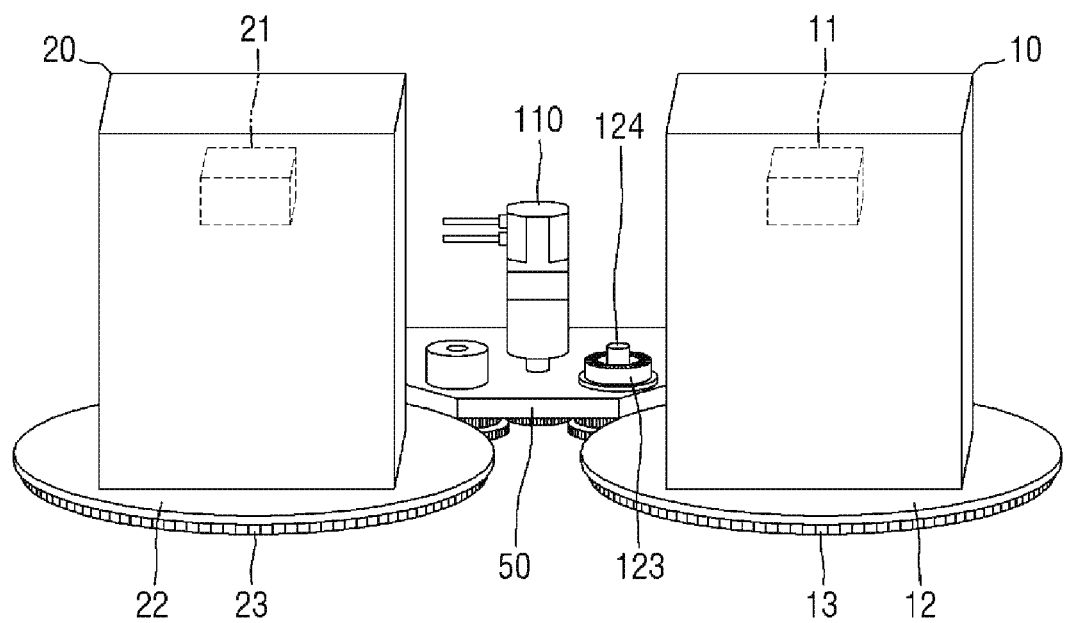
FIG. 1 is a perspective view illustrating a multi-curing apparatus according to exemplary embodiments of the present disclosure.

Exemplary embodiments of the present disclosure will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be further understood that when a component is referred to as being 'on', 'connected to', 'coupled to', or 'adjacent to' another component, it can be directly on, connected to, coupled to, or adjacent to the other component, or intervening components may also be present. It will also be understood that when a component is referred to as being 'between' two components, it can be the only component between the two components, or one or more intervening components may also be present.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. A curing process used during the manufacturing of a semiconductor device, a liquid crystal display (LCD), a solar cell, a light emitting diode (LED), etc. rotates an energy source head and transmits energy to a wafer to increase process uniformity of a front surface of the wafer. The same process is performed simultaneously by using a multi-chamber to enhance productivity of the curing process. In this case, characteristics of the process between chambers is required to coincide with one another.

Exemplary embodiments of the present disclosure relate to a multi-curing apparatus for synchronizing relative positions between a plurality of chambers, that is, aligning positions of the plurality of chambers.

Hereinafter, a multi-curing apparatus according to exemplary embodiments of the present disclosure will be described with reference to FIGS. 1 to 4.

Figure 2:
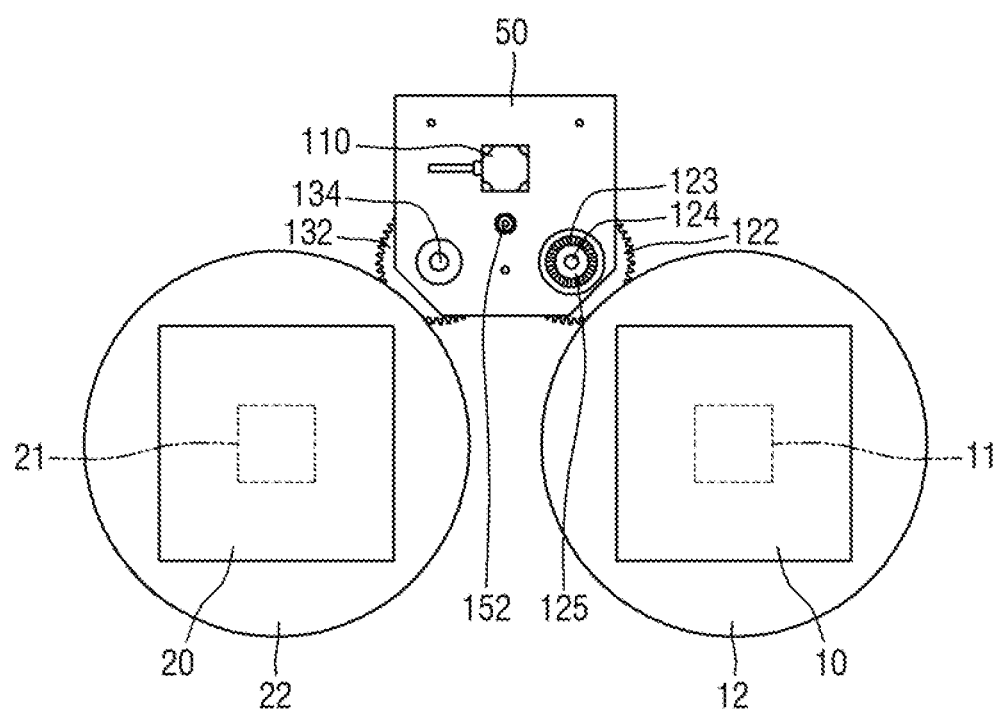
FIG. 2 is a top view illustrating a multi-curing apparatus according to exemplary embodiments of the present disclosure.
Figure 3:
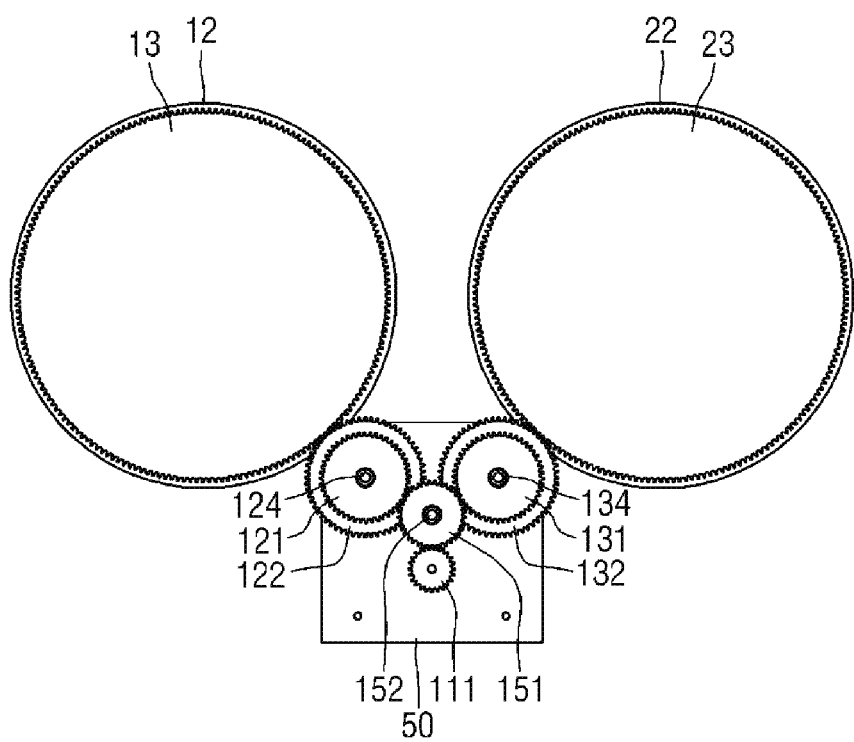
FIG. 3 is a bottom view illustrating a multi-curing apparatus according to exemplary embodiments of the present disclosure.
Figure 4:
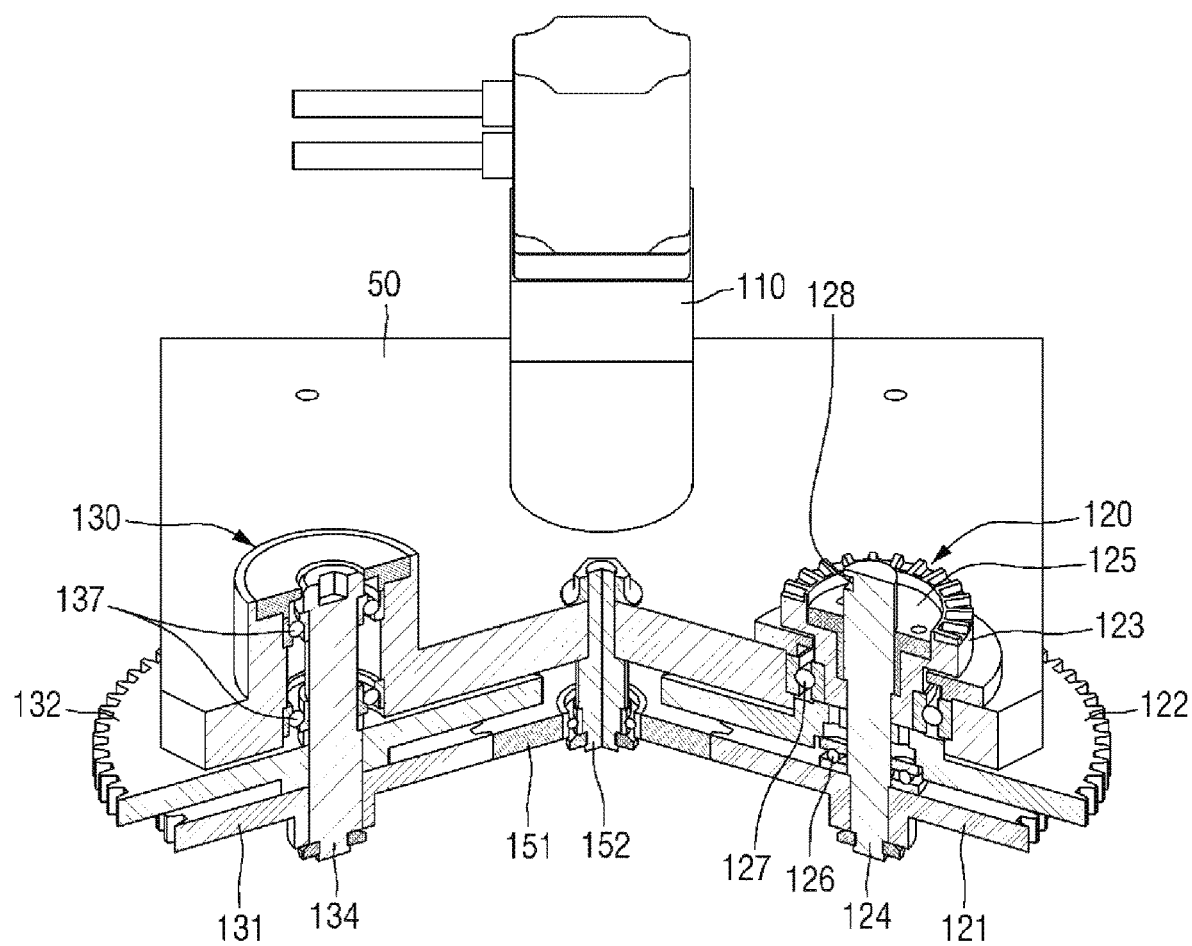
FIG. 4 is a partial cross-sectional view illustrating a multi-curing apparatus according to exemplary embodiments of the present disclosure.

FIG. 1 is a perspective view illustrating a multi-curing apparatus according to exemplary embodiments. FIG. 2 is a top view illustrating the multi-curing apparatus according to exemplary embodiments. FIG. 3 is a bottom view illustrating the multi-curing apparatus according to exemplary embodiments. FIG. 4 is a partial cross-sectional view illustrating the multi-curing apparatus according to exemplary embodiments.

Referring to FIGS. 1 to 4, the multi-curing apparatus according to exemplary embodiments includes a first chamber 10, a first disk 12, a first head gear 13, a second chamber 20, a second disk 22, a second head gear 23, an actuator 110, an actuator gear 111, a first driver 120, a second driver 130, a jog gear driver 140 (see FIG. 8), a third rotation transmission gear 151, and a rotation transmission shaft 152.

A main body 50 may perform a base frame function of the multi-curing apparatus. Although FIG. 2 depicts that the main body 50 has a flat plate shape, the shape of the main body 50 is not limited thereto.

The actuator 110 may be connected to an upper surface of the main body 50. The actuator 110 may be connected to the actuator gear 111, which penetrates through the main body 50 and is disposed on a lower surface of the main body 50. The actuator gear 111 may be rotated by the actuator 110.

The rotation transmission shaft 152 may be spaced apart from the actuator 110. The third rotation transmission gear 151 may be disposed on the lower surface of the main body 50, and may be rotated about the rotation transmission shaft 152.

The third rotation transmission gear 151 may be gear-engaged with the actuator gear 111. Accordingly, the third rotation transmission gear 151 may be rotated by the actuator 110.

Herein, when two elements are described as being "gear-engaged," it is to be understood that the elements are physically coupled to each other via at least one gear. As a result, the state of one of the elements may affect the state of the other element. Unless the context indicates otherwise, the two elements may be directly gear-engaged with each other, or indirectly gear-engaged with each other (e.g., one or more intervening elements, such as one or more additional gears, may be used to gear-engage the two elements).

The first chamber 10 may be disposed on the first disk 12 having a flat plate shape. The first chamber 10 may be connected with the actuator 110 via the first head gear 13 disposed on a lower portion of the first disk 12.

The first chamber 10 may include a first energy source head 11 disposed therein. The first energy source head 11 may be, for example, an ultraviolet (UV) energy source that provides energy in the form of UV rays to a substrate disposed inside the first chamber 10. However, the first energy source head 11 is not limited to a UV energy source that provides UV rays. For example, in exemplary embodiments, the first energy source head 11 may be a different type of energy source that provides energy in a form other than UV rays to the substrate disposed inside the first chamber 10.

The second chamber 20 may be disposed on the second disk 22 having a flat plate shape. The second chamber 20 may be connected with the actuator 110 via the second head gear 23 disposed on a lower portion of the second disk 22.

The second chamber 20 may include a second energy source head 21 disposed therein. The second energy source head 21 may be, for example, a UV energy source that provides energy in the form of UV rays to a substrate disposed inside the second chamber 20. However, the second energy source head 21 is not limited to a UV energy source that provides UV rays. For example, in exemplary embodiments, the second energy source head 21 may be a different type of energy source that provides energy in a form other than UV rays to the substrate disposed inside the second chamber 20.

Although FIGS. 1 to 4 illustrate that the first and second chambers 10 and 20 are connected to the one actuator 110, the present disclosure is not limited thereto. For example, in exemplary embodiments, three or more chambers may be connected to the one actuator 110.

The first head gear 13 and the second head gear 23 may be disposed on the same plane. However, the present disclosure is not limited thereto.

The first driver 120 may be connected to the main body 50. The first driver 120 may be gear-engaged with the first chamber 10 and the actuator 110. The first driver 120 may transmit power provided from the actuator 110 to the first chamber 10, thereby rotating the first chamber 10. This will be described in greater detail below.

The first driver 120 may include a first rotation transmission gear 121, a first driving gear 122, a first jog gear 123, a first jog 124, a first mechalock 125, a first bearing 126, a second bearing 127, and a first jog key recess 128.

Although FIGS. 1 to 4 depict that the first rotation transmission gear 121 and the first driving gear 122 respectively have a gear shape, the present disclosure is not limited thereto. For example, in exemplary embodiments, the first rotation transmission gear 121 may be a first rotation power transmitter including a power transmission element different than the gear, and the first driving gear 122 may be a first driving power transmitter including a power transmission element different than the gear.

The first jog 124 may be disposed to penetrate through the main body 50. In addition, the first jog 124 may be disposed to penetrate through the first jog gear 123, the first driving gear 122, and the first rotation transmission gear 121 in sequence, which will be described below.

The first jog 124 may include the first jog key recess 128. The first jog key recess 128 may be formed to be recessed from one end exposed on the first jog gear 123, which will be described below.

The first rotation transmission gear 121 may be disposed on a lower portion of the main body 50. The first rotation transmission gear 121 may be connected with the first jog 124, and may be rotated about a rotation axis of the first jog 124. In this case, the first rotation transmission gear 121 may be integrally connected with the first jog 124 and may be rotated.

The first rotation transmission gear 121 may be gear-engaged with the third rotation transmission gear 151. Thus, the first rotation transmission gear 121 may be gear-engaged with the actuator 110. The first rotation transmission gear 121 may be disposed on the same plane as the third rotation transmission gear 151. However, the present disclosure is not limited thereto.

The first driving gear 122 may be disposed on the first rotation transmission gear 121. For example, the first driving gear 122 may be disposed between the first rotation transmission gear 121 and the main body 50. The first driving gear 122 may be rotated about the rotation axis of the first jog 124.

The first driving gear 122 may be gear-engaged with the first head gear 13. Thus, the first driving gear 122 may be gear-engaged with the first chamber 10. The first driving gear 122 may be disposed on the same plane as the first head gear 13. However, the present disclosure is not limited thereto.

The first driver 120 may transmit power provided from the actuator 110 to the first chamber 10 via the actuator gear 111, the third rotation transmission gear 151, the first rotation transmission gear 121, the first driving gear 122, the first head gear 13, and the first disk 12, thereby rotating the first chamber 10.

The first jog gear 123 may be disposed on and connected to the first driving gear 122. The first jog gear 123 may contact the first driving gear 122. The first jog gear 123 may be disposed to be exposed on an upper surface of the main body 50.

The first jog gear 123 may be connected with the first driving gear 122, and may be rotated about the rotation axis of the first jog 124. In this case, the first jog gear 123 may be integrally connected with the first driving gear 122 and may be rotated.

The first mechalock 125 may be disposed between the first jog 124 and the first jog gear 123, and may connect the first jog 124 and the first jog gear 123 to each other. The first mechalock 125 may be removably disposed.

When the first mechalock 125 is disposed between the first jog 124 and the first jog gear 123, the first mechalock 125 may be connected between the first jog 124 and the first jog gear 123 using friction. Accordingly, the first jog 124 and the first jog gear 123 may be integrally rotated.

When the first mechalock 125 is released between the first jog 124 and the first jog gear 123, the first jog gear 123 may be rotated independently from the first jog 124.

For example, when the first mechalock 125 is released between the first jog 124 and the first jog gear 123, the first jog gear 123 and the first driving gear 122 may be rotated independently from the first jog 124 and the first rotation transmission gear 121. That is, the first driving gear 122 may be driven with the first rotation transmission gear 121 being fixed.

Herein, when an element(s) is described as being "fixed," it is to be understood that at that time, the element(s) is not moving. For example, although a particular element may be driven at certain times during a curing process, that particular element may be fixed (e.g., not driven and not moving) during other times during the curing process. The first mechalock 125 may be fastened to the first jog gear 123 using, for example, a bolt. However, the present disclosure is not limited thereto.

The first bearing 126 may be disposed between the first rotation transmission gear 121 and the first driving gear 122. When the first mechalock 125 is released between the first jog 124 and the first jog gear 123, the first bearing 126 may guide the first driving gear 122 to be rotated independently from the first rotation transmission gear 121.

The second bearing 127 may be disposed between the first jog gear 123 and the main body 50. The second bearing 127 may guide the first jog gear 123 to be rotated.

The second driver 130 may be connected to the main body 50. The second driver 130 may be gear-engaged with the second chamber 20 and the actuator 110. The second driver 130 may transmit power provided from the actuator 110 to the second chamber 20, thereby rotating the second chamber 20. This will be described in greater detail below.

The second driver 130 may include a second rotation transmission gear 131, a second driving gear 132, a second driver shaft 134, and a third bearing 137.

Although FIGS. 1 to 4 depict that the second rotation transmission gear 131 and the second driving gear 132 respectively have a gear shape, the present disclosure is not limited thereto. For example, in exemplary embodiments, the second rotation transmission gear 131 may be a second rotation power transmitter including a power transmission element different than the gear, and the second driving gear 132 may be a second driving power transmitter including a power transmission element different than the gear.

The second driver shaft 134 may be disposed to penetrate through the main body 50. In addition, the second driver shaft 134 may be disposed to penetrate through the second driving gear 132 and the second rotation transmission gear 131 in sequence, which will be described below.

The second rotation transmission gear 131 may be disposed on a lower portion of the main body 50. The second rotation transmission gear 131 may be connected with the second driver shaft 134, and may be rotated about a rotation axis of the second driver shaft 134. In this case, the second rotation transmission gear 131 may be integrally connected with the second driver shaft 134 and may be rotated.

The second rotation transmission gear 131 may be gear-engaged with the third rotation transmission gear 151. Thus, the second rotation transmission gear 131 may be gear-engaged with the actuator 110. The second rotation transmission gear 131 may be disposed on the same plane as the third rotation transmission gear 151. However, the present disclosure is not limited thereto.

The second driving gear 132 may be disposed on the second rotation transmission gear 131. For example, the second driving gear 132 may be disposed between the second rotation transmission gear 131 and the main body 50. The second driving gear 132 may be rotated about the rotation axis of the second driver shaft 134. In this case, the second driving gear 132 may be integrally connected with the second driver shaft 134 and may be rotated.

The second driving gear 132 may be gear-engaged with the second head gear 23. Thus, the second driving gear 132 may be gear-engaged with the second chamber 20. The second driving gear 132 may be disposed on the same plane as the second head gear 23. That is, the second driving gear 132 may be disposed on the same plane as the first driving gear 122. However, the present disclosure is not limited thereto.

The second driver 130 may transmit power provided from the actuator 110 to the second chamber 20 via the actuator gear 111, the third rotation transmission gear 151, the second rotation transmission gear 131, the second driving gear 132, the second head gear 23, and the second disk 22, thereby rotating the second chamber 20.

The third bearing 137 may be disposed between the second driver shaft 134 and the main body 50. The third bearing 137 may guide the second driver shaft 134 to be rotated.

The sizes of the respective gears illustrated in FIG. 3 are illustrated by way of an example for convenience of explanation, and are not limited thereto.

Figure 8:
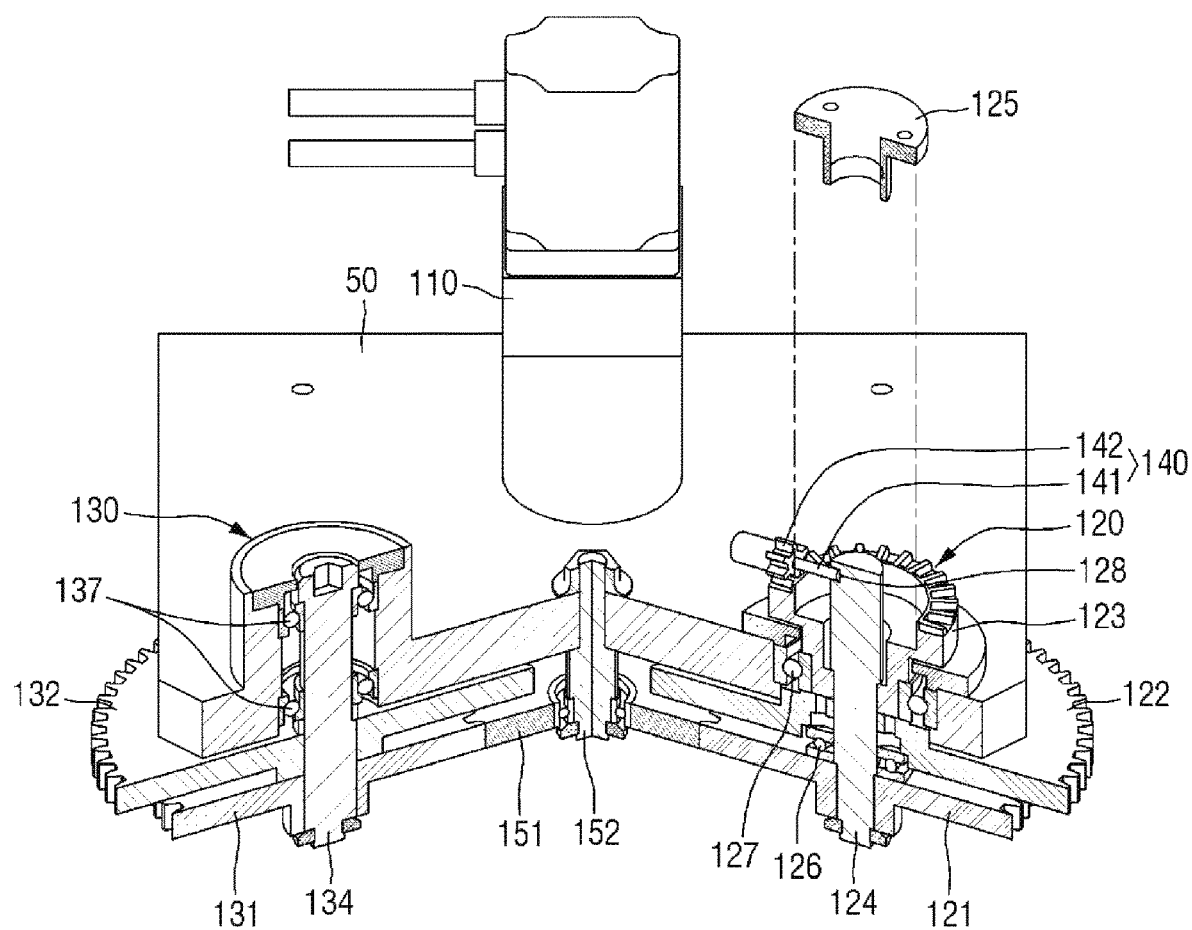

Referring to FIG. 8, the jog gear driver 140 may include an insertion portion 141 and a rotation portion 142. It is to be understood that the shape and the structure of the jog gear driver 140 illustrated in FIG. 8 are illustrated by way of an example for convenience of explanation. In exemplary embodiments, another jog gear driver having a similar structure and function to those of the jog gear driver 140 may be used.

The jog gear driver 140 may be coupled with the first jog 124 and the first jog gear 123. For example, the insertion portion 141 of the jog gear driver 140 may be inserted into the first jog key recess 128, thereby being coupled with the first jog 124, and the rotation portion 142 of the jog gear driver 140 may be gear-engaged with the first jog gear 123.

The jog gear driver 140 may be used to align a position of the first chamber 10 with reference to a position of the second chamber 20 using the first driver 120, with the second chamber 20 being fixed.

For example, the jog gear driver 140 may be used to align the position of the first chamber 10 with reference to the position of the second chamber 20 by driving the first driving gear 122, with the first rotation transmission gear 121, the second rotation transmission gear 131, and the second driving gear 132 being fixed. The operation of the jog gear driver 140 will be described in detail below.

Hereinafter, a method for aligning chambers of a multi-curing apparatus according to exemplary embodiments will be described with reference to FIG. 2 and FIGS. 5 to 8.

Figure 5:
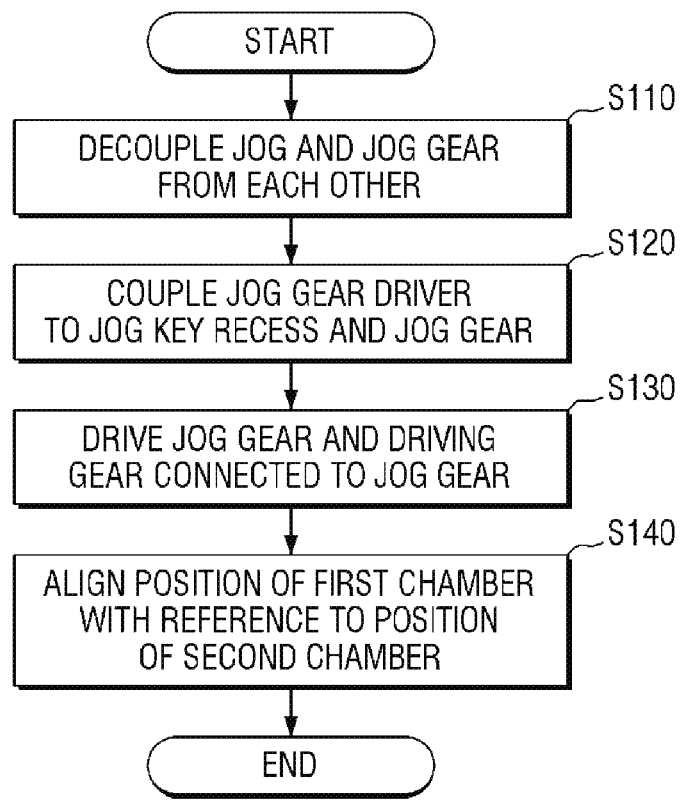
FIG. 5 is a flowchart illustrating a method for aligning chambers of a multi-curing apparatus in sequence according to exemplary embodiments of the present disclosure.
Figure 6:
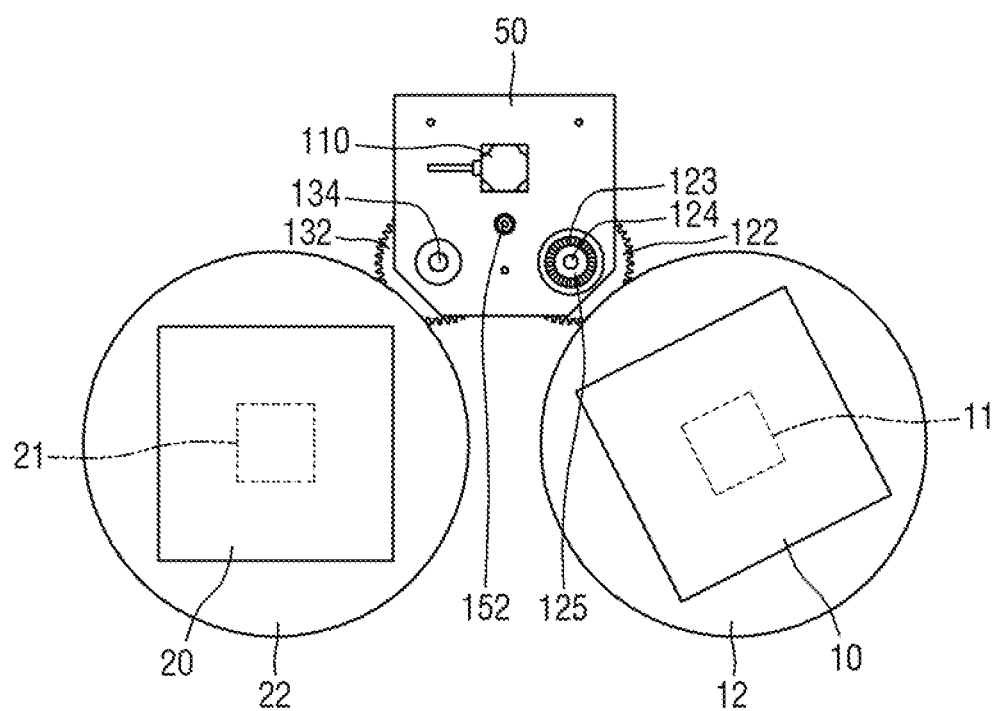
FIGS. 6 to 8 are views provided to describe a method for aligning chambers of a multi-curing apparatus according to exemplary embodiments of the present disclosure.
Figure 7:
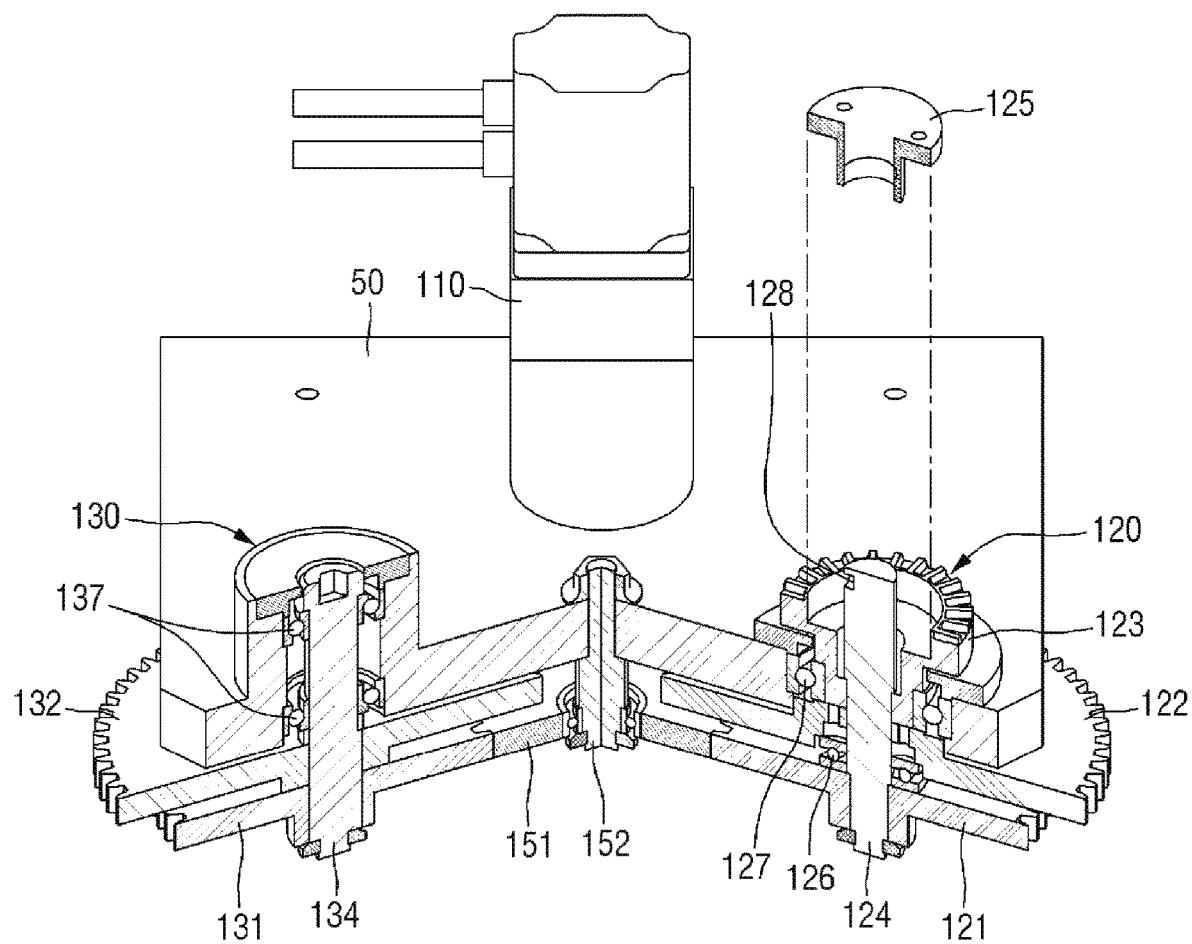

FIG. 5 is a flowchart illustrating a method for aligning chambers of the multi-curing apparatus in sequence according to exemplary embodiments. FIGS. 6 to 8 are views provided to describe the method for aligning the chambers of the multi-curing apparatus according to exemplary embodiments. For convenience of illustration, FIGS. 7 and 8 omit illustration of the first chamber 10, the first disk 12, the first head gear 13, the second chamber 20, the second disk 22, and the second head gear 23.

Referring to FIG. 6, a first substrate is provided in the first chamber 10, which is gear-engaged with the actuator 110 via the first driver 120 (see FIG. 7). The first chamber includes the first energy source head 11. In addition, a second substrate is provided in the second chamber 20, which is gear-engaged with the actuator 110 via the second driver 130 (FIG. 7). The second chamber 20 includes the second energy source head 21.

In this case, as shown in FIG. 6, the position of the first chamber 10 and the position of the second chamber 20 may not be aligned with each other. Herein, "not being aligned" means that one side surface of the first chamber 10 and one side surface of the second chamber 20 are not substantially parallel with each other. For example, as shown in FIG. 6, in the top view, the first chamber 10 is rotated by about 45 degrees relative to the second chamber 20, and as a result, the respective side surfaces of the first chamber 10 and the second chamber 20 are not substantially parallel with each other.

Hereinafter, the description will be made on the assumption that the position of the first chamber 10 and the position of the second chamber 20 are not aligned with each other.

Referring to FIGS. 5 and 7, the first jog 124 and the first jog gear 123 are decoupled from each other (S110).

For example, as shown in FIG. 7, the first jog 124 and the first jog gear 123 may be decoupled from each other by releasing the first mechalock 125 disposed between the first jog 124 and the first jog gear 123.

When the first jog 124 and the first jog gear 123 are decoupled from each other, the first jog gear 123 and the first driving gear 122 may be rotated independently from the first jog 124 and the first rotation transmission gear 121. Accordingly, the first driving gear 122 may be driven independently with the first rotation transmission gear 121 being fixed.

Referring to FIGS. 5 and 8, the jog gear driver 140 is coupled to the first jog key recess 128 and the first jog gear 123 (S120).

For example, the insertion portion 141 of the jog gear driver 140 may be inserted into the first jog key recess 128, thereby being coupled with the first jog 124, and the rotation portion 142 of the jog gear driver 140 may be gear-engaged with the first jog gear 123.

Subsequently, the first jog gear 123 and the first driving gear 122 connected to the first jog gear 123 are driven (S130).

For example, the first jog gear 123 may be rotated by rotating the rotation portion 142 of the jog gear driver 140, with the jog gear driver 140 being fixed to the first jog 124 using the insertion portion 141 of the jog gear driver 140. Accordingly, the first driving gear 122 integrally connected with the first jog gear 123 may be rotated.

Referring to FIGS. 5 and 2, the position of the first chamber 10 is aligned with reference to the position of the second chamber 20 (S140).

For example, the position of the first chamber 10 may be aligned with reference to the position of the second chamber 20 using the first driver 120 (see FIG. 7), with the position of the second chamber 20 being fixed.

For example, the position of the first chamber 10 may be aligned with reference to the position of the second chamber 20 by driving the first driving gear 122 by rotating the rotation portion 142 of the jog gear driver 140, with the first rotation transmission gear 121, the second rotation transmission gear 131, and the second driving gear 132 being fixed.

Herein, "being aligned" means that one side surface of the first chamber 10 and one side surface of the second chamber 20 are substantially parallel with each other, as shown, for example, in FIG. 2.

The multi-curing apparatus according to exemplary embodiments has been described on the assumption that an operator aligns the positions between the plurality of chambers by manually driving the jog gear driver 140.

However, the present disclosure is not limited thereto. For example, in exemplary embodiments, the operator may manually determine whether the plurality of chambers are aligned, and the jog gear driver may be automatically driven. In addition, in exemplary embodiments, both alignment/misalignment between the plurality of chambers, and driving of the jog gear driver, may be automatically performed.

The multi-curing apparatus according to exemplary embodiments may align the positions of the plurality of chambers by using one actuator. This may be done using gears which are disposed to adjust the position of the first chamber 10 with the position of the second chamber 20 being fixed.

Accordingly, the multi-curing apparatus according to exemplary embodiments may synchronize the plurality of chambers by aligning the chambers without attaching or detaching the chambers. As a result, efficiency of a curing operation may be improved by reducing a maintenance time. For example, referring to a conventional multi-curing apparatus, chambers may be attached and detached to perform alignment. As a result of this repeated attachment and detachment, maintenance time is increased, and particles may be introduced into the apparatus, which may adversely affect the curing process. Exemplary embodiments improve upon these shortcomings by allowing for the synchronization of a plurality of chambers by aligning the chambers without having to repeatedly attach and detach the chambers.

Hereinafter, a multi-curing apparatus according to exemplary embodiments will be described with reference to FIGS. 9 and 10. For convenience of explanation, a further description of elements previously described will be omitted, and the description will focus on differences compared to the multi-curing apparatus illustrated in FIGS. 2 and 4.

Figure 9:
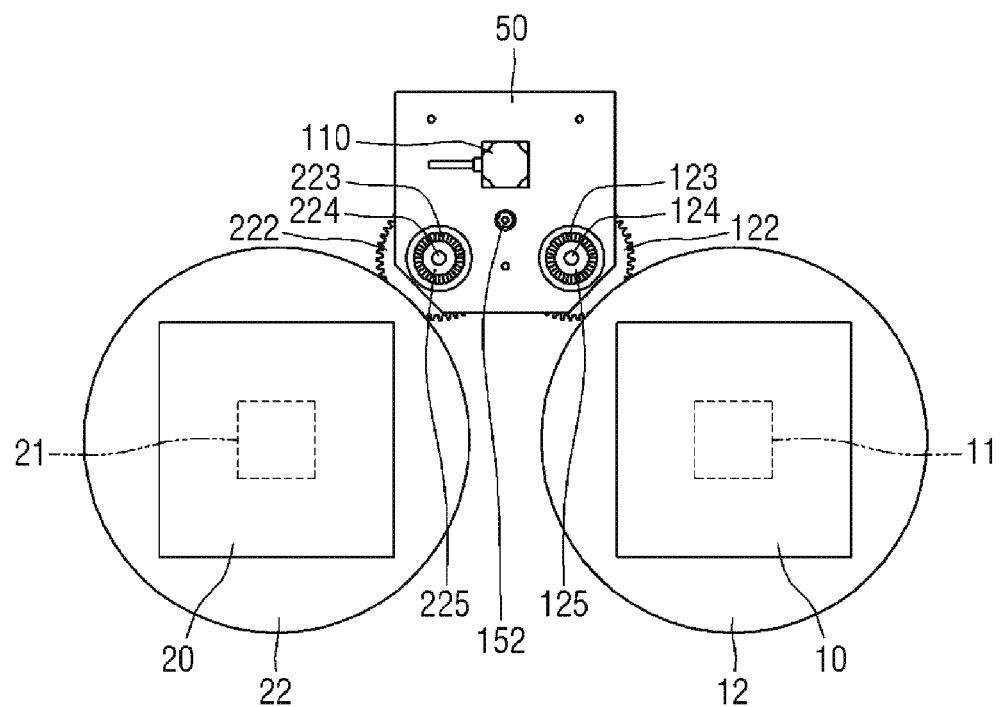
FIG. 9 is a top view illustrating a multi-curing apparatus according to exemplary embodiments of the present disclosure.

FIG. 9 is a top view illustrating a multi-curing apparatus according to exemplary embodiments. FIG. 10 is a partial cross-sectional view illustrating a multi-curing apparatus according to exemplary embodiments.

Figure 10:
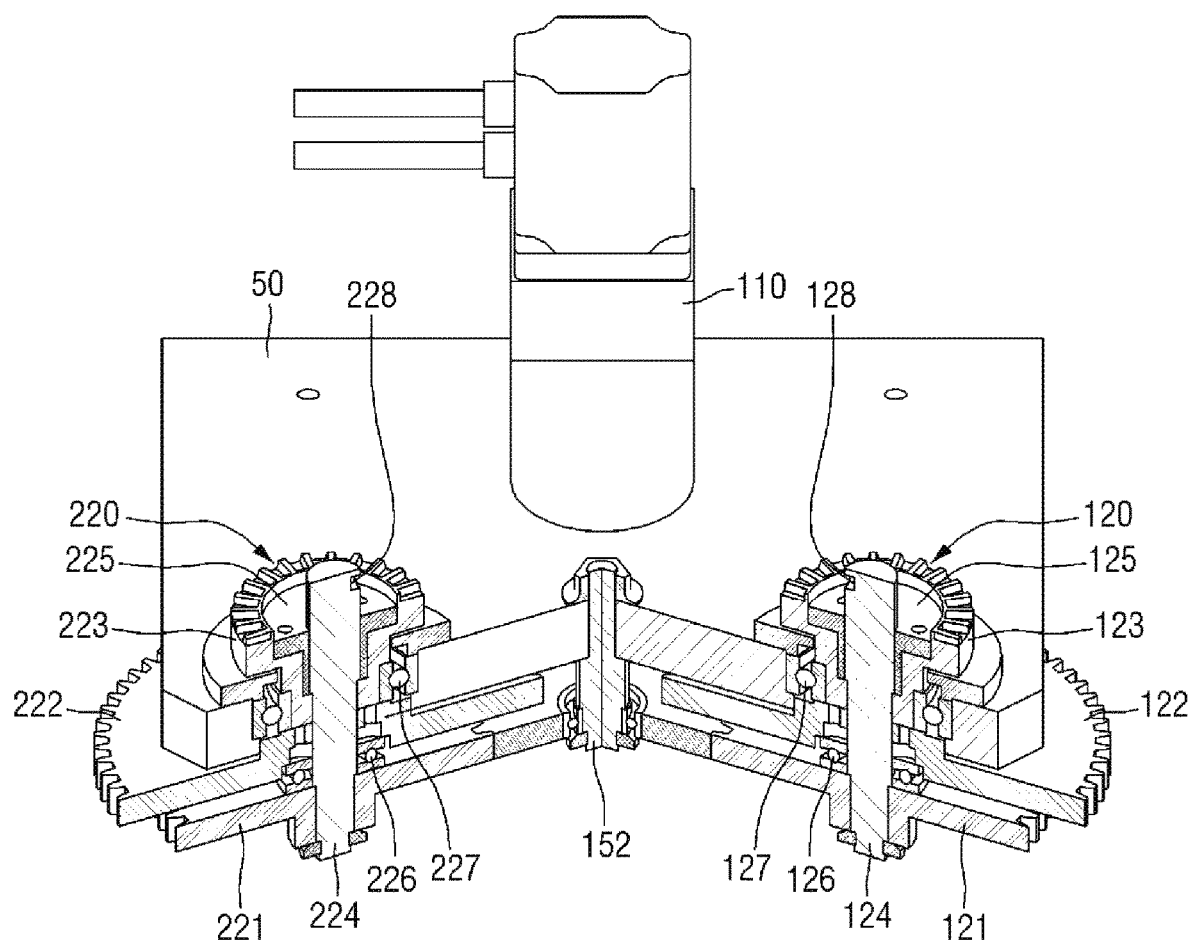
FIG. 10 is a partial cross-sectional view illustrating a multi-curing apparatus according to exemplary embodiments of the present disclosure.

Referring to FIGS. 9 and 10, the multi-curing apparatus according to exemplary embodiments may include a second driver 220, which includes a second rotation transmission gear 221, a second driving gear 222, a second jog gear 223, a second jog 224, a second mechalock 225, a fourth bearing 226, a fifth bearing 227, and a second jog key recess 228.

The configuration and the function of the second driver 220 may be substantially the same as the configuration and the function of the first driver 120.

The multi-curing apparatus according to the exemplary embodiments described with reference to FIGS. 9 and 10 may align the position of the first chamber 10 with reference to the position of the second chamber 20 by driving the first driving gear 122, with the first rotation transmission gear 121, the second rotation transmission gear 221, and the second driving gear 222 being fixed.

In addition, the multi-curing apparatus according to the exemplary embodiments described with reference to FIGS. 9 and 10 may align the position of the second chamber 20 with reference to the position of the first chamber 10 by driving the second driving gear 222, with the first rotation transmission gear 121, the second rotation transmission gear 221, and the first driving gear 122 being fixed.

Hereinafter, a multi-curing apparatus according to exemplary embodiments will be described with reference to FIGS. 11 and 12. For convenience of explanation, a further description of elements previously described will be omitted, and the description will focus on differences compared to the multi-curing apparatus illustrated in FIGS. 2 and 3.

Figure 11:
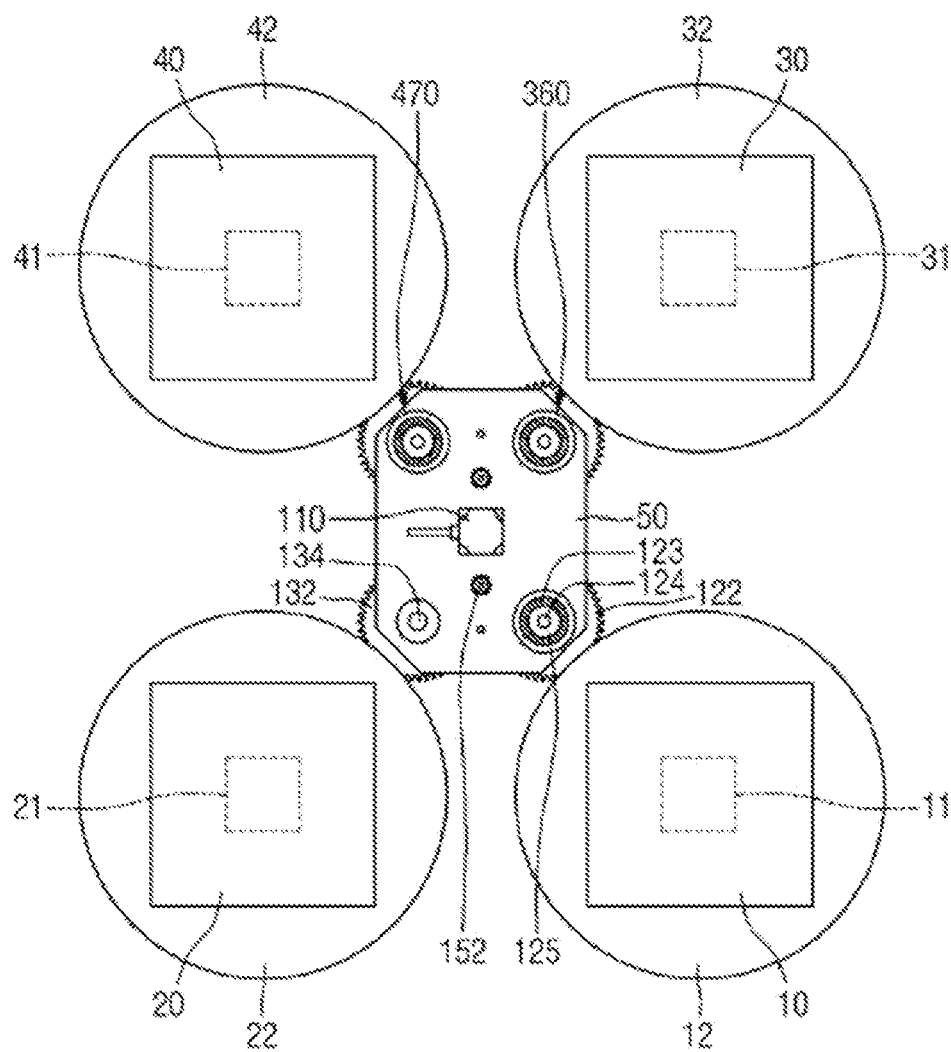
FIG. 11 is a top view illustrating a multi-curing apparatus according to exemplary embodiments of the present disclosure.

FIG. 11 is a top view illustrating a multi-curing apparatus according to exemplary embodiments. FIG. 12 is a bottom view illustrating the multi-curing apparatus according to exemplary embodiments.

Figure 12:
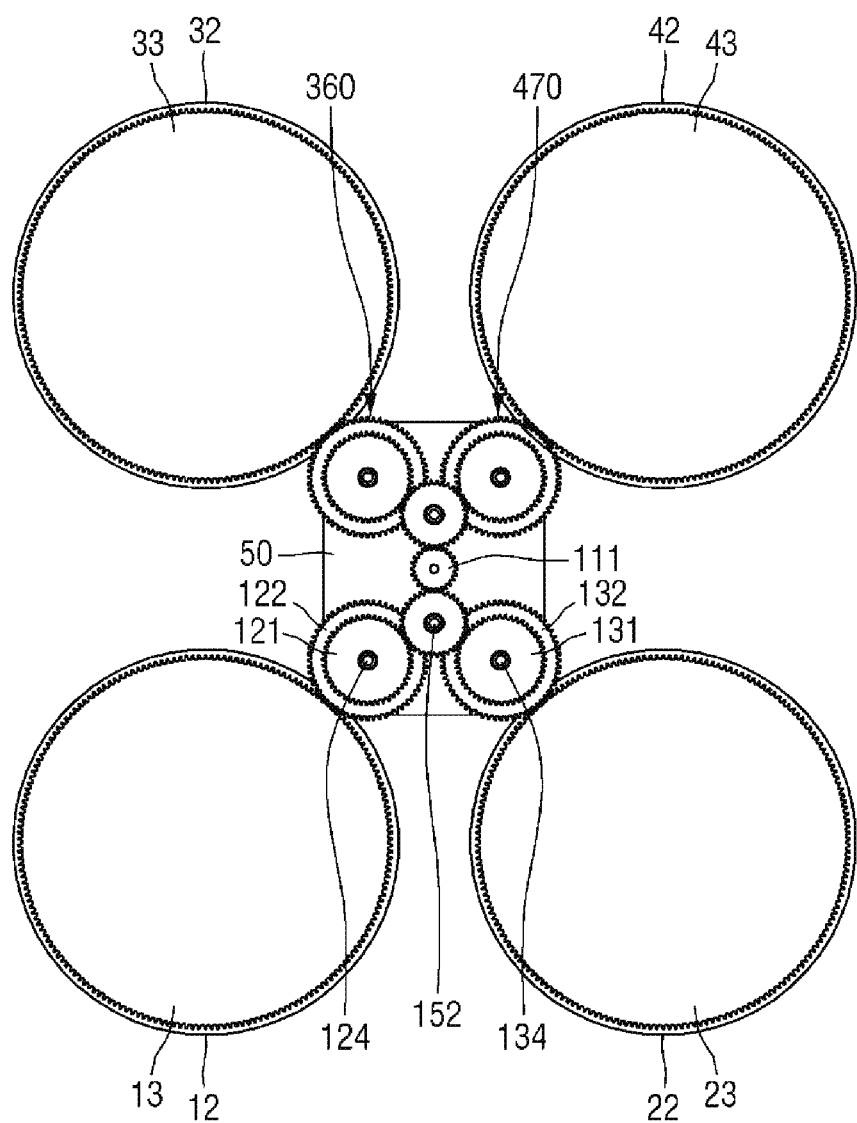
FIG. 12 is a bottom view illustrating a multi-curing apparatus according to exemplary embodiments of the present disclosure.

Referring FIGS. 11 and 12, the multi-curing apparatus according to exemplary embodiments may have four chambers 10, 20, 30, 40 connected to one actuator 110.

A third chamber 30 including a third energy source head 31 may be gear-engaged with a third driver 360 via a third head gear 33 disposed on a lower portion of a third disk 32. The third driver 360 may be gear-engaged with the actuator 110 and the third chamber 30. In addition, a fourth chamber 40 including a fourth energy source head 41 may be gear-engaged with a fourth driver 470 via a fourth head gear 43 disposed on a lower portion of a fourth disk 42.

The third driver 360 and the fourth driver 470 may have substantially the same configuration and function as those of the first driver 120 (see FIG. 4).

A position of the third chamber 30 may be aligned with reference to the position of the second chamber 20 by driving the third driver 360. In addition, a position of the fourth chamber 40 may be aligned with reference to the position of the second chamber 20 by driving the fourth driver 470.

Thus, the multi-curing apparatus according to exemplary embodiments may align the positions of the four chambers 10, 20, 30, 40 by using the one actuator 110.

Hereinbelow, a multi-curing apparatus according to exemplary embodiments will be described with reference to FIGS. 13 to 15. For convenience of explanation, a further description of elements previously described will be omitted, and the description will focus on differences compared to the multi-curing apparatus illustrated in FIGS. 1 to 8.

Figure 13:
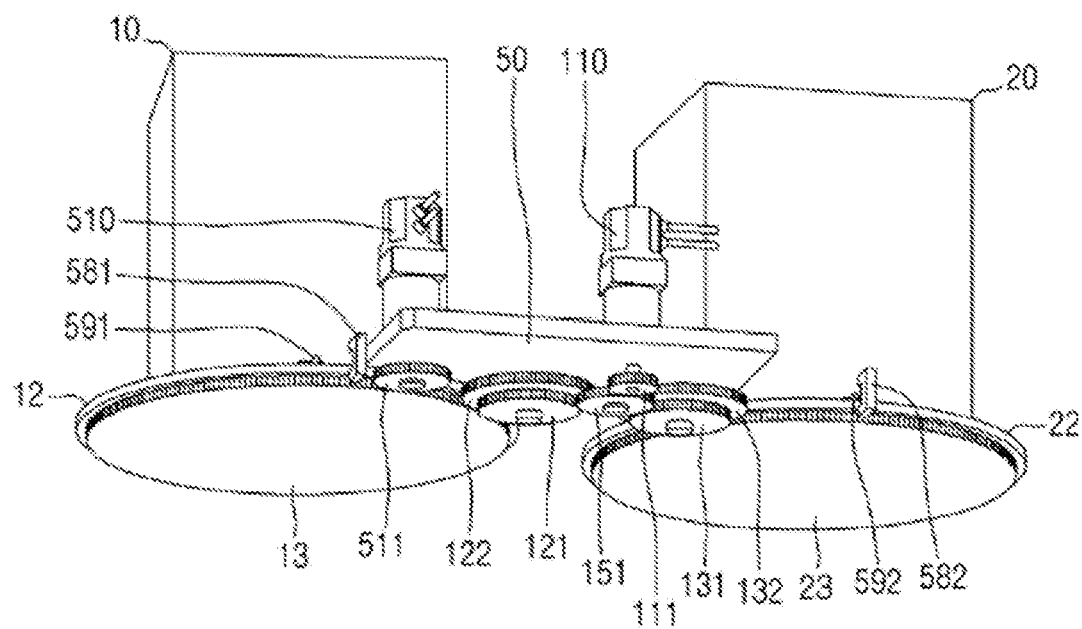
FIG. 13 is a perspective view illustrating a multi-curing apparatus according to exemplary embodiments of the present disclosure.

FIG. 13 is a perspective view illustrating a multi-curing apparatus according to exemplary embodiments of the present disclosure. FIGS. 14 and 15 are views provided to describe a method for aligning chambers of a multi-curing apparatus according to exemplary embodiments of the present disclosure.

Figure 14:
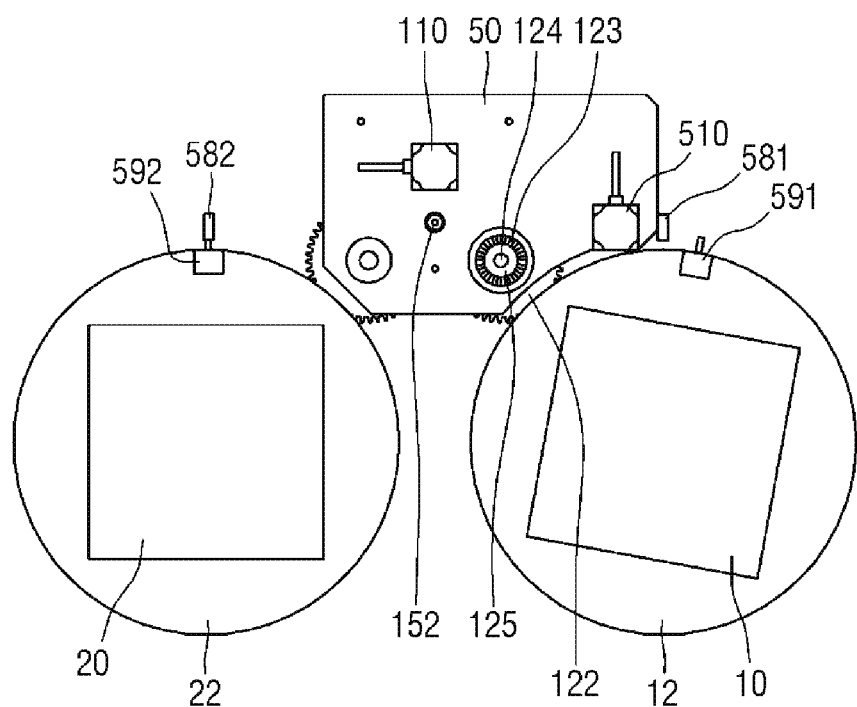
FIGS. 14 and 15 are views provided to describe a method for aligning chambers of a multi-curing apparatus according to exemplary embodiments of the present disclosure.
Figure 15:
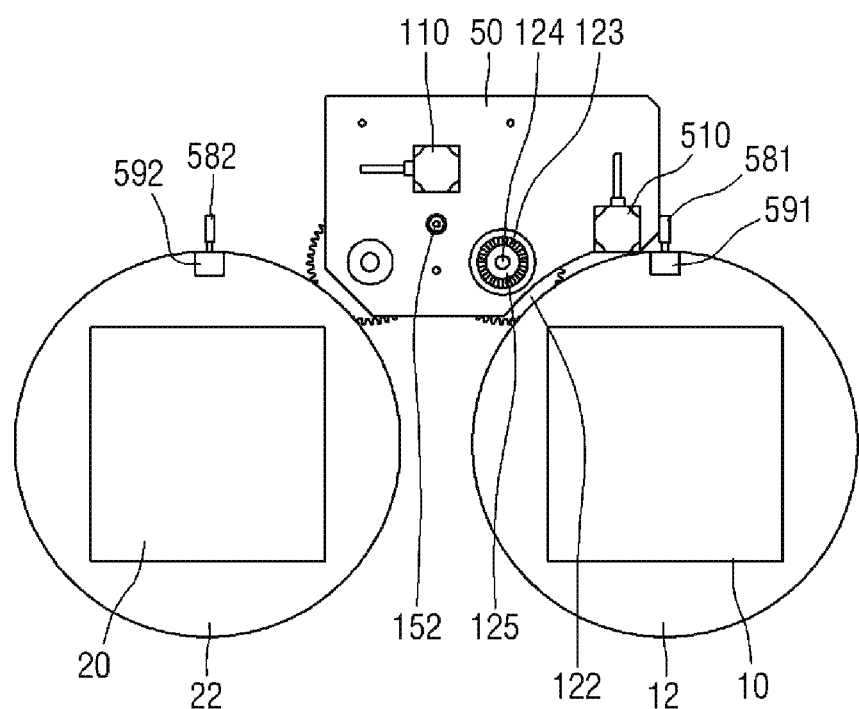

Referring to FIGS. 13 to 15, the multi-curing apparatus according to exemplary embodiments may include an align actuator 510, an align gear 511, a first sensor 581, a second sensor 582, a first sensing pin 591, and a second sensing pin 592.

The align actuator 510 may be connected to an upper surface of the main body 50. The align actuator 510 may be connected to the align gear 511, which penetrates through the main body 50, and is arranged on a lower surface of the main body 50. The align gear 511 may be rotated by the align actuator 510.

The align gear 511 may be spaced apart from the first driving gear 132. The align gear 511 may be arranged on the same plane as the first driving gear 132. However, the present disclosure is not limited thereto.

The align gear 511 may be gear-engaged with the first chamber 10. For example, the align gear 511 may be gear-engaged with the first head gear 13, which is arranged on a lower portion of the first chamber 10. The align gear 511 may be arranged on the same plane as the first head gear 13. However, the present disclosure is not limited thereto.

The first sensor 581 may be arranged on a side surface of the main body 50. Although FIG. 13 depicts that the first sensor 581 is directly connected to a side surface of the main body 50, this is only for convenience of illustration, and the present disclosure is not limited thereto. For example, in exemplary embodiments, the first sensor 581 may be spaced apart from the main body 50.

The second sensor 582 may be arranged on a side surface of the main body 50. Although FIG. 13 depicts that the second sensor 582 is spaced apart from a side surface of the main body 50, this is only for convenience of illustration, and the present disclosure is not limited thereto. For example, in exemplary embodiments, the second sensor 582 may be directly connected to a side surface of the main body 50.

The first sensing pin 591 may be established in the first disk 12. The first sensing pin 591 may be arranged on the same plane as the first sensor 581. The first sensor 581 may sense position information of the first chamber 10, which is arranged on the first disk 12, by using the first sensing pin 591.

The second sensing pin 592 may be established in the second disk 22. The second sensing pin 592 may be arranged on the same plane as the second sensor 582. The second sensor 582 may sense position information of the second chamber 20, which is arranged on the second disk 22, by using the second sensing pin 592.

FIGS. 13 and 14 exemplify a state in which a position of the first chamber 10 and a position of the second chamber 20 are not aligned after the first substrate is provided within the first chamber 10.

In this case, for example, the second sensing pin 592 may be positioned to be in contact with the second sensor 582, and the first sensing pin 591 may be positioned to be spaced apart from the first sensor 581.

Referring to FIGS. 13 and 15, the align actuator 510 may align a position of the first chamber 10 with reference to a position of the second chamber 20 by driving the align gear 511 and rotating the first chamber 10 with a position of the second chamber 20 being fixed.

The align actuator 510 may drive the align gear 511 by using position information of the first chamber 10 sensed via the first sensor 581 and position information of the second chamber 20 sensed via the second sensor 582. In this case, the align actuator 510 may rotate the first chamber 10 by driving the align gear 511 so that the first sensing pin 591 is in contact with the first sensor 581.

Hereinbelow, a method for fabricating a semiconductor chip by using a multi-curing apparatus according to exemplary embodiments will be described with reference to FIGS. 1 and 16.

FIG. 16 is a flowchart illustrating a method for fabricating a semiconductor chip by using a multi-curing apparatus according to exemplary embodiments of the present disclosure.

Referring to FIGS. 1 and 16, the first substrate may be provided within the first chamber 10 gear-engaged with the actuator 110 via the first driver 120, and the second substrate may be provided within the second chamber 20 gear-engaged with the actuator 110 via the second driver 130 (S210).

Subsequently, a position of the first chamber 10 may be aligned with reference to a position of the second chamber 20 by driving the first driver 120 with the second driver 130 being fixed, in utilization of the method for aligning chambers of the multi-curing apparatus as described with reference to FIG. 5 (S220).

Subsequently, a curing process may be performed on the first substrate by using the first energy source head 11 arranged on the first chamber 10, and a curing process may be performed on the second substrate by using the second energy source head 21 arranged on the second chamber 20. The curing processes with respect to the first and second substrates may be simultaneously performed (S230). A semiconductor chip may be fabricated with the above-described curing process as a middle process.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A multi-curing apparatus, comprising:
an actuator;
a first chamber comprising a first energy source head;
a second chamber comprising a second energy source head;
a first driver comprising a first rotation transmission gear and a first driving gear,
wherein the first rotation transmission gear is gear-engaged with the actuator, and the first driving gear is gear-engaged with the first chamber; and
a second driver comprising a second rotation transmission gear and a second driving gear,
wherein the second rotation transmission gear is gear-engaged with the actuator, and the second driving gear is gear-engaged with the second chamber,
wherein the multi-curing apparatus aligns a position of the first chamber with reference to a position of the second chamber,
wherein the first rotation transmission gear, the second rotation transmission gear, and the second driving gear are fixed while the multi-curing apparatus aligns the position of the first chamber.

2. The multi-curing apparatus of claim 1, wherein the first driver further comprises:
a jog gear disposed on and connected to the first driving gear; and
a jog that penetrates through the first rotation transmission gear, the first driving gear, and the jog gear, and that is connected to the first rotation transmission gear.

3. The multi-curing apparatus of claim 2, further comprising:
a jog key recess that is recessed from one end of the jog exposed on the jog gear.

4. The multi-curing apparatus of claim 3, further comprising:
a jog gear driver coupled to the jog key recess,
wherein the jog gear driver is gear-engaged with the jog gear, and drives the jog gear and the first driving gear.

5. The multi-curing apparatus of claim 2, further comprising:
a mechalock removably disposed between the jog and the jog gear, wherein the mechalock connects the jog and the jog gear to each other.

6. The multi-curing apparatus of claim 5, wherein the multi-curing apparatus aligns the position of the first chamber with reference to the position of the second chamber by:
decoupling the jog and the jog gear from each other by releasing the mechalock; and
driving the first driving gear connected to the jog gear by driving the jog gear.

7. The multi-curing apparatus of claim 1, further comprising:
a third chamber comprising a third energy source head; and
a third driver gear-engaged with the actuator and the third chamber,
wherein the multi-curing apparatus aligns a position of the third chamber with reference to the position of the second chamber by driving the third driver.

8. The multi-curing apparatus of claim 1, further comprising:
an align gear gear-engaged with the first chamber and spaced apart from the first driving gear; and
an align actuator connected with the align gear, wherein the align actuator drives the align gear.

9. The multi-curing apparatus of claim 8, wherein the multi-curing apparatus aligns the position of the first chamber with reference to the position of the second chamber by rotating the first chamber by driving the align gear with the position of the second chamber being fixed.

10. The multi-curing apparatus of claim 8, further comprising:
a first sensor that senses position information of the first chamber; and
a second sensor that senses position information of the second chamber,
wherein the align actuator drives the align gear by using the position information of the first chamber and the position information of the second chamber.

11. A multi-curing apparatus, comprising:
an actuator;
a first chamber comprising a first energy source head;
a second chamber comprising a second energy source head;
a first driver gear-engaged with the actuator and the first chamber; and
a second driver gear-engaged with the actuator and the second chamber,
wherein the first driver comprises:
a first rotation transmission gear gear-engaged with the actuator;
a first driving gear disposed on the first rotation transmission gear and gear-engaged with the first chamber;
a first jog gear disposed on and connected to the first driving gear;
a first jog that penetrates through the first rotation transmission gear, the first driving gear, and the first jog gear, and that is connected to the first rotation transmission gear; and
a first mechalock removably disposed between the first jog and the first jog gear, and connecting the first jog and the first jog gear to each other,
wherein the multi-curing apparatus aligns a position of the first chamber with reference to a position of the second chamber by using the first driver,
wherein the position of the second chamber is fixed while the multi-curing apparatus aligns the position of the first chamber with reference to the position of the second chamber.

12. The multi-curing apparatus of claim 11, wherein the multi-curing apparatus aligns the position of the first chamber with reference to the position of the second chamber by driving the first driving gear while the first rotation transmission gear is fixed.

13. The multi-curing apparatus of claim 11, wherein the second driver comprises:
- a second rotation transmission gear gear-engaged with the actuator;
- a second driving gear disposed on the second rotation transmission gear and gear-engaged with the second chamber;
- a second jog gear disposed on and connected to the second driving gear;
- a second jog that penetrates through the second rotation transmission gear, the second driving gear, and the second jog gear, and that is connected to the second rotation transmission gear; and
- a second mechalock removably disposed between the second jog and the second jog gear, and connecting the second jog and the second jog gear to each other.

14. The multi-curing apparatus of claim 13, wherein the multi-curing apparatus aligns the position of the second chamber with reference to the position of the first chamber by driving the second driving gear,
  wherein the first rotation transmission gear, the second rotation transmission gear, and the first driving gear are fixed while the multi-curing apparatus drives the second driving gear.

15. A method for fabricating a semiconductor chip, the method comprising:
  providing a first substrate in a first chamber gear-engaged with an actuator via a first driver;
  providing a second substrate in a second chamber gear-engaged with the actuator via a second driver;
  aligning a position of the first chamber with reference to a position of the second chamber by driving the first driver with the second driver being fixed; and
  curing the first substrate and the second substrate respectively,
  wherein the first driver comprises a first rotation transmission gear gear-engaged with the actuator and a first driving gear gear-engaged with the first chamber, and the second driver comprises a second rotation transmission gear gear-engaged with the actuator and a second driving gear gear-engaged with the second chamber.

16. The method of claim 15, wherein aligning the position of the first chamber with reference to the position of the second chamber comprises:
  driving the first driving gear with the first rotation transmission gear, the second rotation transmission gear, and the second driving gear being fixed.

17. The method of claim 15, wherein the first driver further comprises:
- a jog gear connected with the first driving gear;
- a jog that penetrates through the first driving gear and the jog gear, respectively, and that is connected with the first rotation transmission gear; and
- a mechalock that is removably arranged between the jog and the jog gear and that connects the jog and the jog gear to each other.

18. The method of claim 17, wherein aligning the position of the first chamber with reference to the position of the second chamber comprises:
  decoupling the jog and the jog gear from each other by releasing the mechalock; and
  driving the first driving gear connected with the jog gear by driving the jog gear.

19. The method of claim 18, wherein driving the first driving gear comprises:
  coupling a jog gear driver to a jog key recess formed to be recessed from one end of the jog;
  gear-engaging the jog gear driver with the jog gear; and
  driving the first driving gear connected with the jog gear by driving the jog gear driver.

20. The method of claim 15, further comprising:
- an align gear gear-engaged with the first chamber and spaced apart from the first driving gear; and
- an align actuator connected with the align gear, wherein the align actuator drives the align gear.

* * * * *